United States Patent
Day et al.

(10) Patent No.: US 6,977,833 B2
(45) Date of Patent: Dec. 20, 2005

(54) CMOS ISOLATION CELL FOR EMBEDDED MEMORY IN POWER FAILURE ENVIRONMENTS

(75) Inventors: Brian A. Day, Colorado Springs, CO (US); Frantisek Gasparik, Monument, CO (US)

(73) Assignee: LSI Logic Corporation, Milpitas, CA (US)

( * ) Notice: Subject to any disclaimer, the term of this patent is extended or adjusted under 35 U.S.C. 154(b) by 136 days.

(21) Appl. No.: 10/695,929

(22) Filed: Oct. 28, 2003

(65) Prior Publication Data

US 2005/0088901 A1   Apr. 28, 2005

(51) Int. Cl.[7] .................................................. G11C 8/00
(52) U.S. Cl. ......................................... 365/52; 365/226
(58) Field of Search ............................ 365/52, 189.05, 365/189.07, 189.08, 189.09, 226, 230.03

(56) References Cited

U.S. PATENT DOCUMENTS

| | | | |
|---|---|---|---|
| 5,978,262 A * | 11/1999 | Marquot et al. | 365/189.05 |
| 6,205,078 B1 * | 3/2001 | Merritt | 365/226 |
| 6,650,589 B2 * | 11/2003 | Clark | 365/226 |
| 6,781,915 B2 * | 8/2004 | Arimoto et al. | 365/189.08 |

* cited by examiner

*Primary Examiner*—Trong Phan
(74) *Attorney, Agent, or Firm*—Suiter West Swantz PC LLO

(57) ABSTRACT

An embedded memory on an integrated circuit chip is capable of being isolated from other on chip and off chip circuitry during power failure modes on the integrated circuit chip. The embedded memory preferably has its own external power supply. When power on chip fails or falls below a threshold level, input to and output from the embedded memory is prohibited by CMOS isolation cells. The CMOS isolation cells are controlled by enable signals and the power level of other power supplies within the integrated circuit.

6 Claims, 8 Drawing Sheets

CMOS ISOLATION CELL FOR EMBEDDED MEMORY IN POWER FAILURE ENVIRONMENTS

FIELD OF THE INVENTION

The present invention generally relates to the field of semiconductors, and particularly to semiconductor memory within an integrated circuit.

BACKGROUND OF THE INVENTION

Redundant Array of Independent Disks (RAID) controller chips use memory blocks for various functions such as data transfer and storage. RAID controllers require some type of non-volatile storage to maintain information such a data cache in the event of power failure. As the RAID controller's primary function is to ensure data coherency, it must be able to preserve the history of all relevant input/output (IO) activity to the storage medium. Typically, this has been done using separate, specialized off-chip RAM components, which increases the overall solution cost. Providing this same capability within the RAID controller itself reduces the overall cost. One current technique for retaining data uses the non-volatile features such as a floating gate process (MNOS—Metal-Nitride-Oxide-Semiconductor) which allows retaining the data while the power is turned off. Another current technique to data retention is known by using the piggy-back battery power up of the Static RAM, such as used in the PC BIOS stand alone chips. However, the standard complementary metal oxide semiconductor (CMOS) technology used by redundant array of independent disks (RAID) input/output (IO) controllers is not amenable to these techniques.

It would be very desirable to have the following features while the RAID controller is powered down: 1) data retained in embedded RAM while the rest of the chip circuitry, such as peripheral drivers/receivers and all core logic, are powered down, 2) maintenance of the stored data in embedded RAM undisturbed during the power-down and power-up of the rest of the chip, and 3) logic circuitry to externally control the states of "sleep" (to power down the I/O and core logic) and "wake" (to resume normal operation).

Therefore, it would be desirable to provide a circuit and method for preventing spurious data from being written to or read from an embedded RAM.

SUMMARY OF THE INVENTION

Accordingly, the present invention is directed to a circuit and method for isolating an embedded memory of an integrated circuit chip from other on chip circuitry during a drop in power.

In an embodiment of the present invention, isolation cells prevent the passage of data signals to and/or from an embedded memory on an integrated circuit chip. The embedded memory and isolation circuitry are preferably exclusively located in a dedicated portion of the wafer. The isolation cells are controlled by one or more enable signals and one or more switches tied to power levels elsewhere present within the integrated circuit. For example, the power for core logic circuitry may control one of the switches. If any power level falls below a threshold level, the switch is turned off, thereby preventing data transfer. The isolation cells of the present invention primarily include one or more series of transistors that are controlled by the enable signals and/or the power levels. Each series of transistors links adjacent transistors by source to drain or drain to drain connections. A series may be formed of transistors in parallel in which the drains are connected to a common node and the sources are connected to a negative power supply or ground. There may be a single series of transistors in a totem pole arrangement. In an embodiment, one or more power levels from the integrated circuit control corresponding gates of transistors.

The present invention includes a method for isolating an embedded memory during a power fault condition. If all non-embedded memory power is powered up appropriately, the isolation cells permit the embedded memory to be enabled for data transfers. If a tapped power level falls below a threshold, then the embedded memory is isolated from data transfers with other integrated circuit circuitry.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The present invention relates to an isolation cell useable with an embedded memory on an integrated circuit chip. The isolation cell is preferably controlled by one or more enable signals and tapped power points from integrated circuit circuitry not part of the isolated embedded memory. The present invention also relates to the combination of the isolation cell with the embedded memory. Furthermore, the present invention relates to a method for isolating an embedded memory on an integrated circuit chip. Although the present invention directly relates to the field of RAID IO controllers, it applies to any type of application where data is required to be maintained across power-failure events.

Figure 1:
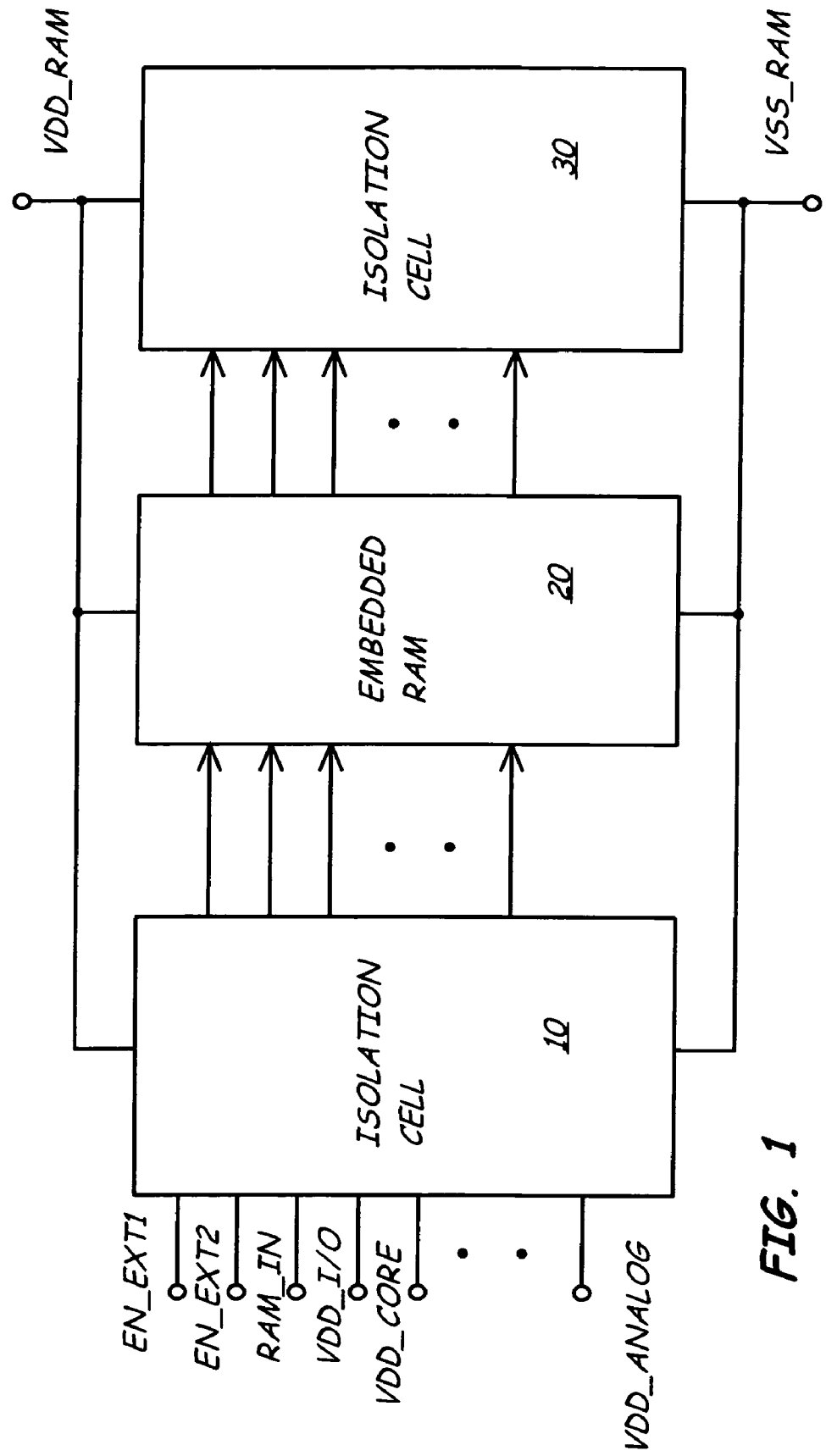
FIG. 1 illustrates a block diagram of an embodiment of the present invention.

Electronic systems on a chip contain a variety of functional blocks such as memory, etc. It is often desirable to retain the memory data in a small portion of the chip, while powering up only this portion of the circuitry and powering down the rest of the chip. During the power-up and power-down sequences or after removing the power from the system, there is a need for isolating the powered up memory section. FIG. 1 illustrates a block diagram of an embodiment of the present invention. The input to an embedded memory 20 (e.g., an embedded RAM) is controlled through a first isolation cell 10. The output from the embedded memory 20 is controlled through a second isolation cell 30. In this embodiment, two enable signals EN_EXT1 and EN_EXT2 control the input of data to the embedded memory. One un-interruptible power supply (VDD_RAM) is dedicated to the embedded RAM and the controlling circuitry (Isolation Cell). Preferably, at least two other power supplies are used for powering up the rest of the chip. More additional power supplies may be accommodated. A dedicated ground connection (VSS_RAM) is provided. All devices of embedded RAM and the isolation cell must be located in a separate section chip area. All P-channel devices will have their N-Well islands tied to the VDD_RAM power supply. All N-channel sources and their substrate ties are tied to the ground VSS_RAM with appropriate guard rings surrounding all N-channel devices of the embedded RAM and the isolation cell. (In this disclosure, P-channel devices may include PMOS transistors and N-channel devices may include NMOS transistors.) Various tapped power points (e.g., VDD_I/O, VDD_CORE, and VDD_ANALOG) in the integrated circuit also are used to enable transfer of data to the embedded memory 20.

The circuit of the present invention has followed a multi-threaded approach to isolate the functional blocks to guarantee the retention of the embedded RAM data after and during the power up/down. 1) All circuitry related to the embedded RAM and isolation cell circuitry is placed in a separate chip area and has its own un-interruptible power supply (VDD_RAM) and separate ground (VSS_RAM) terminals, with separate N-well, substrate ties and guard rings. 2) Tri-state buffering is used to connect/disconnect the embedded RAM circuitry from the core logic and I/O interface circuits. 3) External signals are used to enable the tri-state buffer. Alternatively, internally generated signals may be used to enable the tri-state buffer (e.g., through internal testing circuitry). 4) Serially connected N-channel devices electrically connect the tri-state buffer ground. The serially connected N-channel devices are driven by the remaining power supplies (ALL OTHER POWER SUPPLIES) on the chip (i.e., VDD_I/O, VDD_Core, VDD_Analog, etc.). Only if all remaining power supplies are turned on will the tri-state buffer be enabled after connecting to its ground (VSS_RAM). None of the transients on the individual power supplies can enable the tri-state buffer because the EN_EXT1 keeps the ground disconnected from the tri-state buffer. Any power supply transients that occur during the re-connection to the main PCB are shielded from affecting the tri-state buffer by serial N-channel device MN3 by the low state of EN_EXT1 signal. 5) After latching the last logic state into the transparent latch, the tri-state buffer is tri-stated and the latch or keeper cell maintains the last state. 6) Even if the printed circuit board (PCB) were removed from the system while keeping the VDD_RAM power supply turned on, the external enable signals EN_EXT1 and EN_EXT2 maintain their low state by means of pull-down resistors RP1 and RP2. Thus, the Isolation Cell remains active, isolating the embedded RAM circuitry from all other power supply and all interfacing signal transients. 7) The RAM outputs are connected to the core and/or to the I/O interface circuits by Isolation Cells, as shown in FIGS. 2–5. 8) Excessive voltage overshoot/undershoot on the normal power supplies during the power-up and power-down transients are clamped by input protection diodes or transistors. As long as both external enable signals EN_EXT1 and EN_EXT2 maintain logic low states, the N-channel device MN3 remains OFF and disconnects any transient currents/voltages from MN1, MN2, and MNx NMOS transistors or other N-channel devices.

The present invention is directed to integrated circuit applications having multiple power supplies. Most of the present integrated circuits have separate power supplies for Input/Output (I/O) receivers and drivers, and for so called core, the internal logic circuitry of the chip. At least two separate power rails are provided in such case. An example of such multiplicity is the 3.3 volt power supply for I/O circuitry (VDD_I/O) and a 1.8 volt power supply for powering the core circuitry (VDD_Core). Still other power supplies are provided for unique functions such as PLL (VDD_Analog), etc. The justifications for separate power supplies are dictated for 1) lowering the power dissipation of core, 2) separating of large currents of switching output drivers, 3) lowering the ground bounce and power rail overshoot, 4) minimizing the crosstalk and coupling into the analog circuitry, etc.

FIGS. 2–5 illustrate first to fourth embodiments of the isolation cell of the present invention. An isolation cell has several inputs. All or a portion VDD power supplies utilized on the chip (VDD_I/O, VDD_Core, VDD_Analog, etc.) except for the embedded power supply VDD_RAM may be used to control the isolation cell. At least one enable digital input EN_EXT1 is connected to an external pin. Alternatively, for embodiments that use internal testing circuitry, the enable signal EN_EXT1 may be supplied internally. Both embedded RAM and Isolation Cell share the dedicated power supply VDD_RAM and VSS_RAM. The isolation cells help to minimize power loss during integrated circuit operations. The isolation cells may be made independently controllable such that one isolation cell may be turned on while another is turned off.

There are four key aspects of the isolation cells of the present invention for guaranteeing the retention of embedded RAM data. 1) The first step in the data protection is the use of tri-state buffer which consists of four N-channel devices (e.g., transistors) MP1, MP2, MN4, and MN5. The PMOS transistor MP1 and NMOS transistor MN4 are controlled by enable signal EN_EXT2. Inputs to embedded RAM, such as depicted input RAM_IN, represents Data, Read/Write and other RAM control signals. These signals are driven by the Core Logic. External Enable signal (active low EN_EXT2) controls the tri-state buffer. If EN_EXT2 is low, the output is tri-stated, i.e., in high-impedance state and any change of RAM_IN pin state does not propagate to tri-state buffer output. Similarly, configured tri-state buffers will be used at the embedded RAM output pins to isolate it from the powered down circuitry that the RAM is driving. 2) To guarantee that the external enable pin EN_EXT2 remains low even when the printed circuit board with SAS SCSI chip is lifted from the system, the pull-down resistor RP1 electrically connects the EN_EXT2 pin to VSS_RAM. The gate of NMOS transistor MN3 is controlled by enable signal EN_EXT1. Pull down resistor RP2, electrically connected to ground VSS_RAM or negative power, determines that an unbiased enable signal will appear as a logic low level at the gate of NMOS transistor MN3. 3) If any and all other chip power supplies (VDD_I/O, VDD_Core, VDD_Analog, etc.) are powered down to a low state, the respective N-channel devices MN1, MN2, and so forth to MNx will remain in Off state. An additional external Enable pin (active low EN_EXT1) is provided to control the power supply sequencing. The cascaded N-channel devices in Off state represent an open path for the ground (VSS_RAM) to tri-state buffer until all other power supplies are powered up. During power up the value maintained by the keeper cell or transparent latch does not change. 4) Multiple NMOS transistors MN1, MN2, MNx are electrically connected source-to-drain in series to a ground or negative power supply VSS_RAM to guarantee that the last logic state of each and every input/output to and from the embedded RAM is maintained. The source of another NMOS transistor MN3 is electrically connected to the drain of the NMOS transistor MNx. The present invention allows for scalability and programmability of the voltage levels applied to the N-channel devices MN1, MN2, MN3, MNx, etc. For example, the voltage applied to an N-channel device gate may be scaled through a voltage divider. A latch may be provided to permit the selection of various resistance values for the voltage divider.

Figure 2:
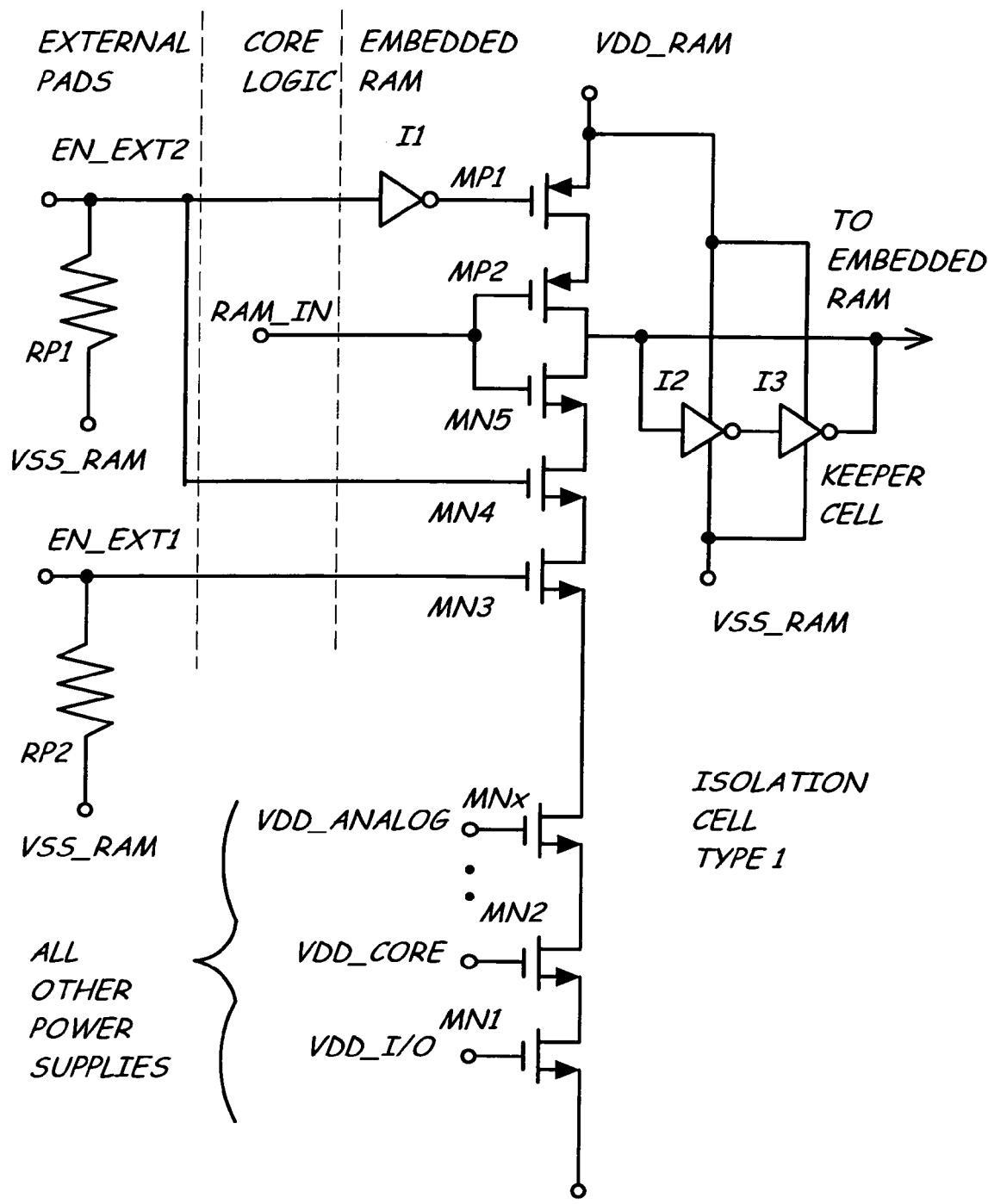
FIG. 2 illustrates a first embodiment of an isolation cell of the present invention.

FIG. 2 shows a first embodiment of an isolation cell. Isolation Cell Type 1, of the present invention for an arbitrary input pin of the embedded RAM. It is understood that a set of eight, sixteen, twenty, or another number of isolation cells may be used for data transfer to and control signals for the embedded member. A different set of isolation cells may be used for the output from the embedded memory. In this embodiment, a totem pole arrangement of PMOS and NMOS transistors implement an enablement mechanism for writing to and reading from an embedded memory. A keeper cell consisting of two inverters is connected to the RAM input and to the tri-state buffer output. As long as the un-interruptible power supply VDD_RAM provides the power to the embedded circuitry, the last logic state will be maintained at that pin. In operation, when enable signal EN_EXT2 is at a logic high, NMOS transistor MN4 and PMOS transistor MP1 are both turned on. The PMOS transistor MP1 is turned on because when enable signal EN_EXT2 is at a logic high level, inverter Ii provides a logic low level to the gate of PMOS transistor MP1. Similar to enable signal EN_EXT1, enable signal EN_EXT2 is tied to ground through pull down resistor RP1. Memory input signal RAM_IN is provided directly to the gates of PMOS transistor MP2 and NMOS transistor MN5. When RAM_IN is at a high logic level, a low logic level is latched by the keeper cell formed by inverters 12 and 13 that are electrically connected in parallel with the output signal line to the embedded RAM. The source of PMOS transistor MP1 is electrically connected to the embedded memory (i.e., RAM) dedicated power VDD_RAM.

Figure 3:
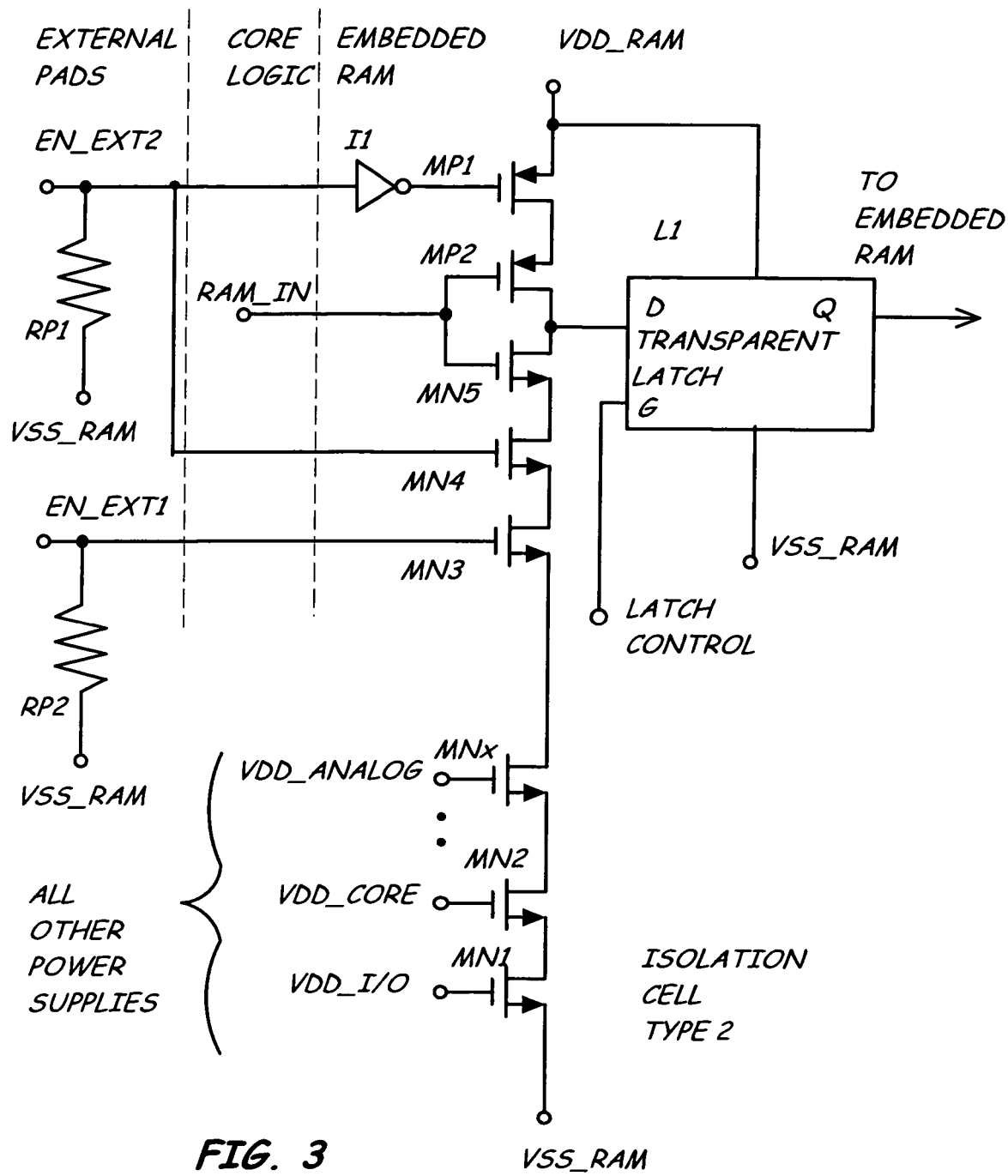
FIG. 3 illustrates a second embodiment of an isolation cell of the present invention.
Figure 4:
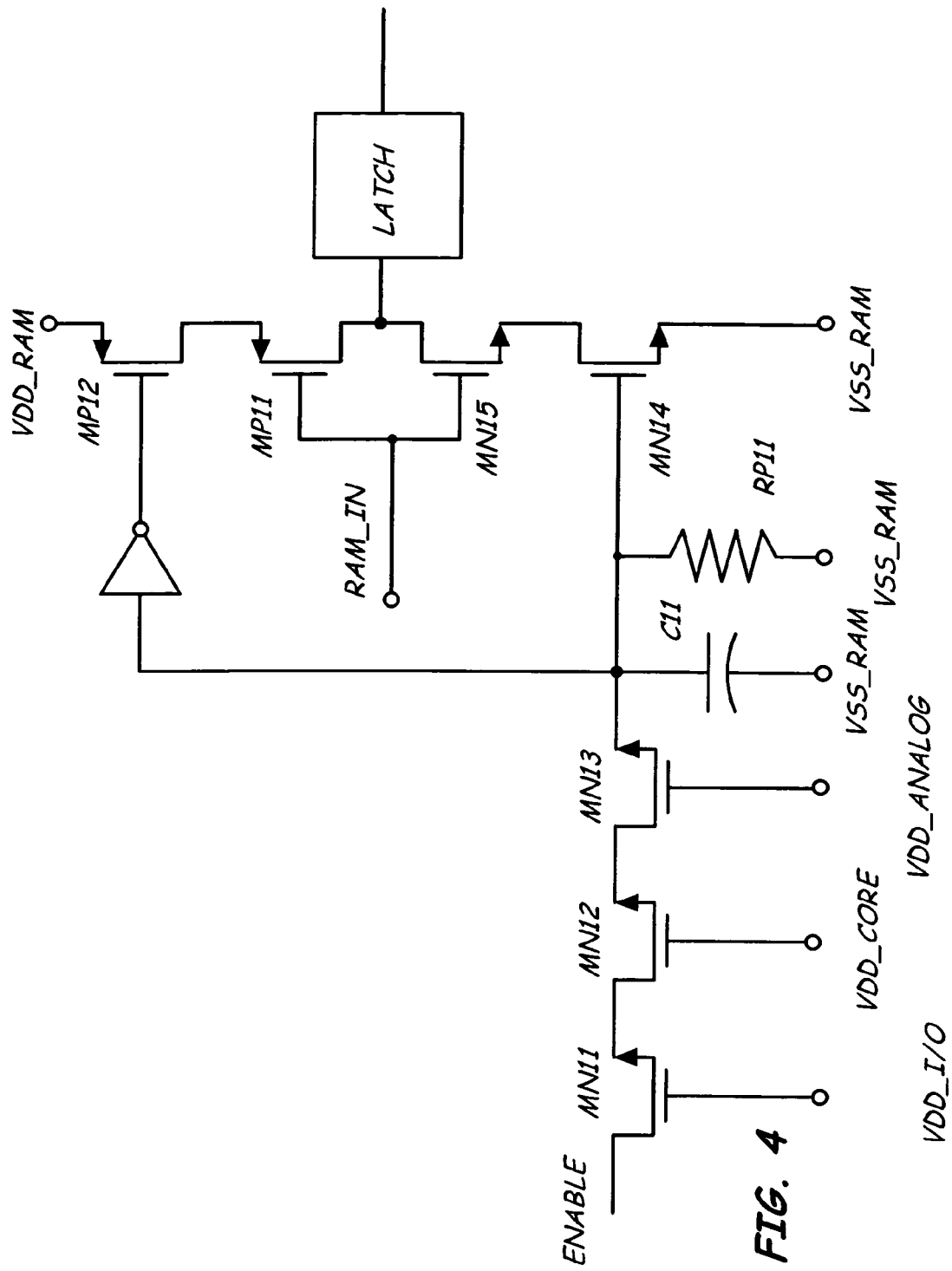
FIG. 4 illustrates a third embodiment of an isolation cell of the present invention.
Figure 5:
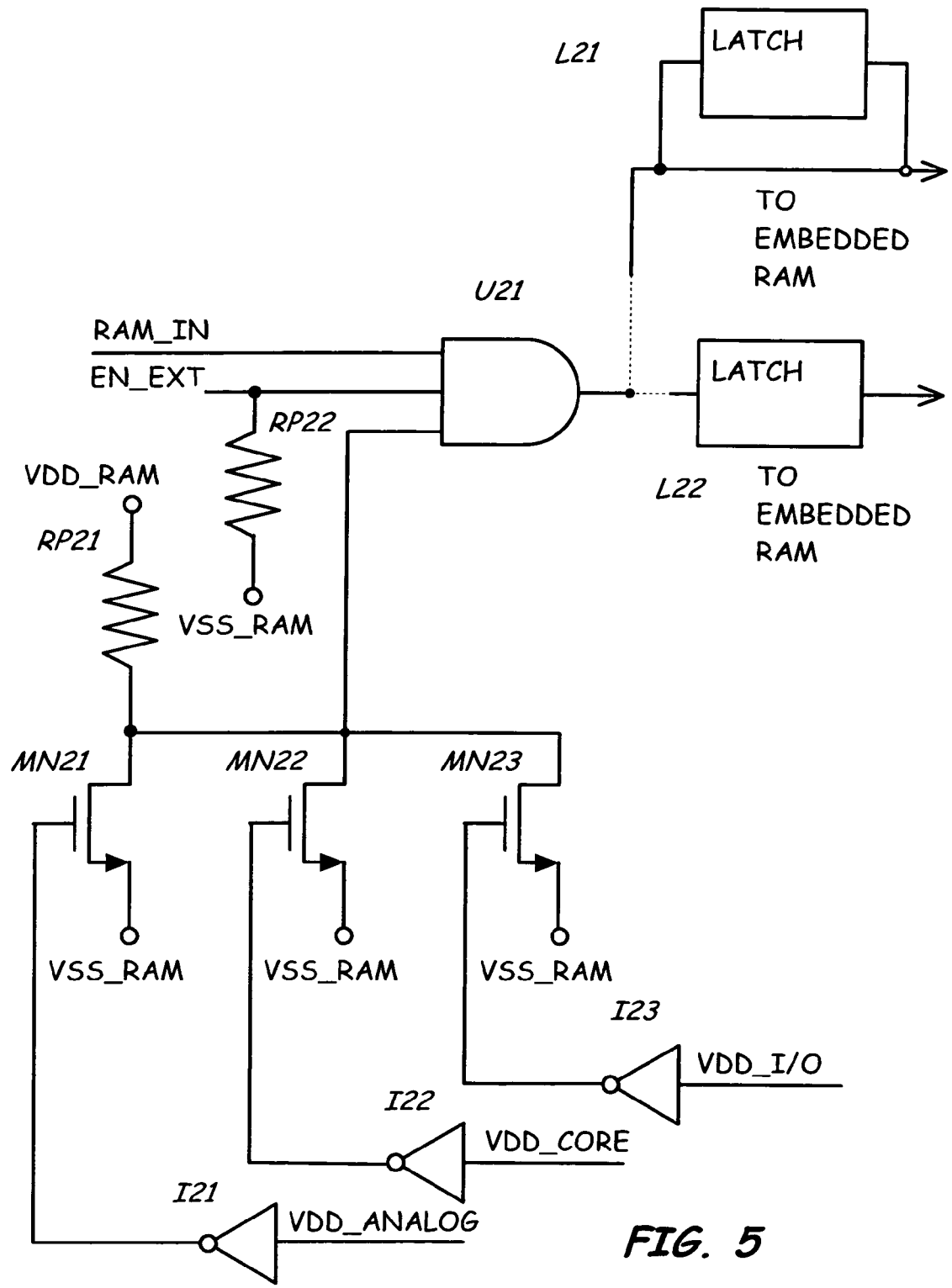
FIG. 5 illustrates a fourth embodiment of an isolation cell of the present invention.

Other variations of the isolation cell may be employed. Various components, such as smoothing capacitors, transmission gates, and pull up resistors may be used in alternative embodiments, including variations of the isolation cell illustrated in FIGS. 2–5. A second embodiment of the isolation cell, Isolation Cell Type 2, of the present invention is shown in FIG. 3. Instead of the keeper cell, a transparent latch L1 with inputs D, G and Q is used to store the last logic state of the particular RAM input. The latch control signal is connected to the G input to allow the last logic state of the tri-state buffer output to be stored in the transparent latch. The latch control signal can be generated in conjunction with external enable signals to ensure that last logic state is reliably stored. The transparent latch is powered by the VDD_RAM power supply. Alternatively, an edge triggered latch may be used. FIG. 4 shows a third embodiment in which the power level controlled transistors MN11, MN12, and MN13 serve as pass gates for an enable signal. The enable signal controls, the PMOS transistor MP12 and NMOS transistor MN14 to allow or prohibit passage of data signal RAM_IN. The output of transistors MN15 and MP11 is latched to stabilize the data for writing to the embedded memory. Optional capacitor C11 smoothes out the enable signal to eliminate glitches and prevent spurious data from being written to the embedded memory. Optional pull down resistor RP11 ensures that the signal applied to switches MN14 and MP12 is never ambiguous in value. FIG. 5 illustrates an embodiment of the isolation cell in which each controlling tapped power level is fed to an inverter I21, I22, and I23 and controls one of multiple NMOS transistors MN21, MN22, and MN23 connected in parallel such that the drains are electrically connected to a common node and the sources are connected to a common ground VSS_RAM or a common negative power supply. The drains are electrically connected to pull up resistor RP21 which guarantees a high level input to AND gate U21 if none of the transistors are turned on. The enable signal input, EN_EXT, coupled to a common ground VSS_RAM through RP22 and the embedded memory input RAM_IN are the other inputs to the AND gate U21. The output of the AND gate U21 is latched by pass through latch L22 or by bypass latch L21. Latches may be implemented as two inverters in tandem, two NAND gates in tandem, two NOR gates in tandem, a tandem combination of inverters, NAND gates and/or NOR gates, or the like. The latches may be D type flip flops. The latches may be transparent, level enabling, or clock edge triggered.

Figure 6:
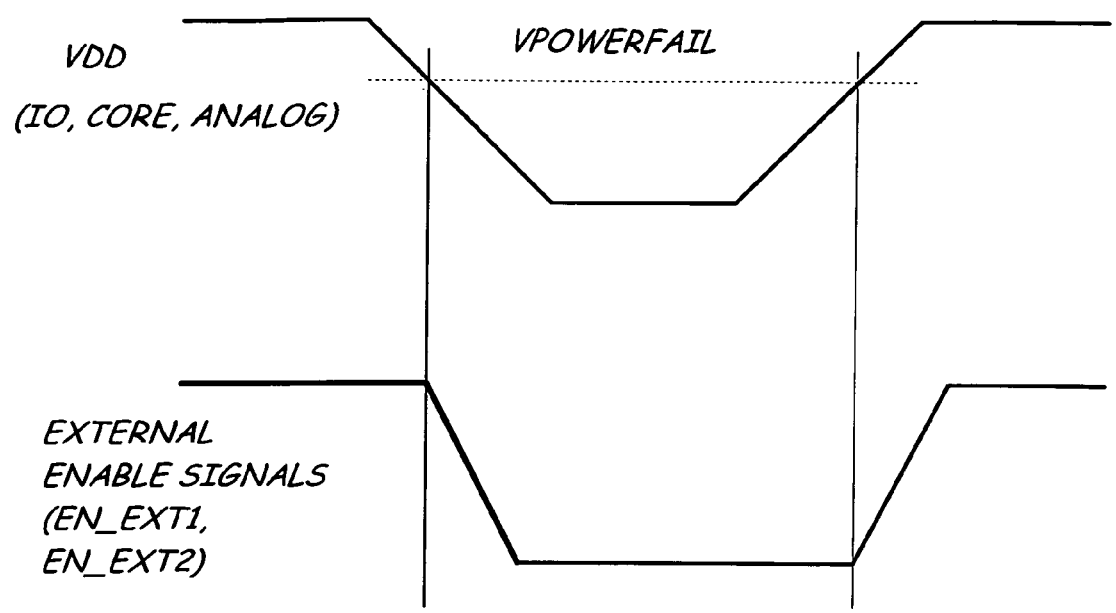
FIG. 6 illustrates a timing diagram of an embodiment of the present invention.

FIG. 6 shows an embodiment of the timing relationships between the voltage supplies and the external enable signals. There are both commodity and custom-designed "supervisor" voltage supply circuits (such as the M40SZ100W from STMicroelectronics) available to monitor and detect power failure conditions at the board level. This Vpowerfail voltage level may be unique to each different board or system implementation. Upon detecting VDD at a lower voltage level than Vpowerfail, the circuit brings the External Enable signals low, thereby isolating the RAM circuitry during low VDD power conditions. Some of these supervisor circuits may also employ a more sophisticated time delay and/or reset circuit during the power-on condition so that temporary power-up conditions are essentially filtered from re-enabling the isolation circuit.

Figure 7:
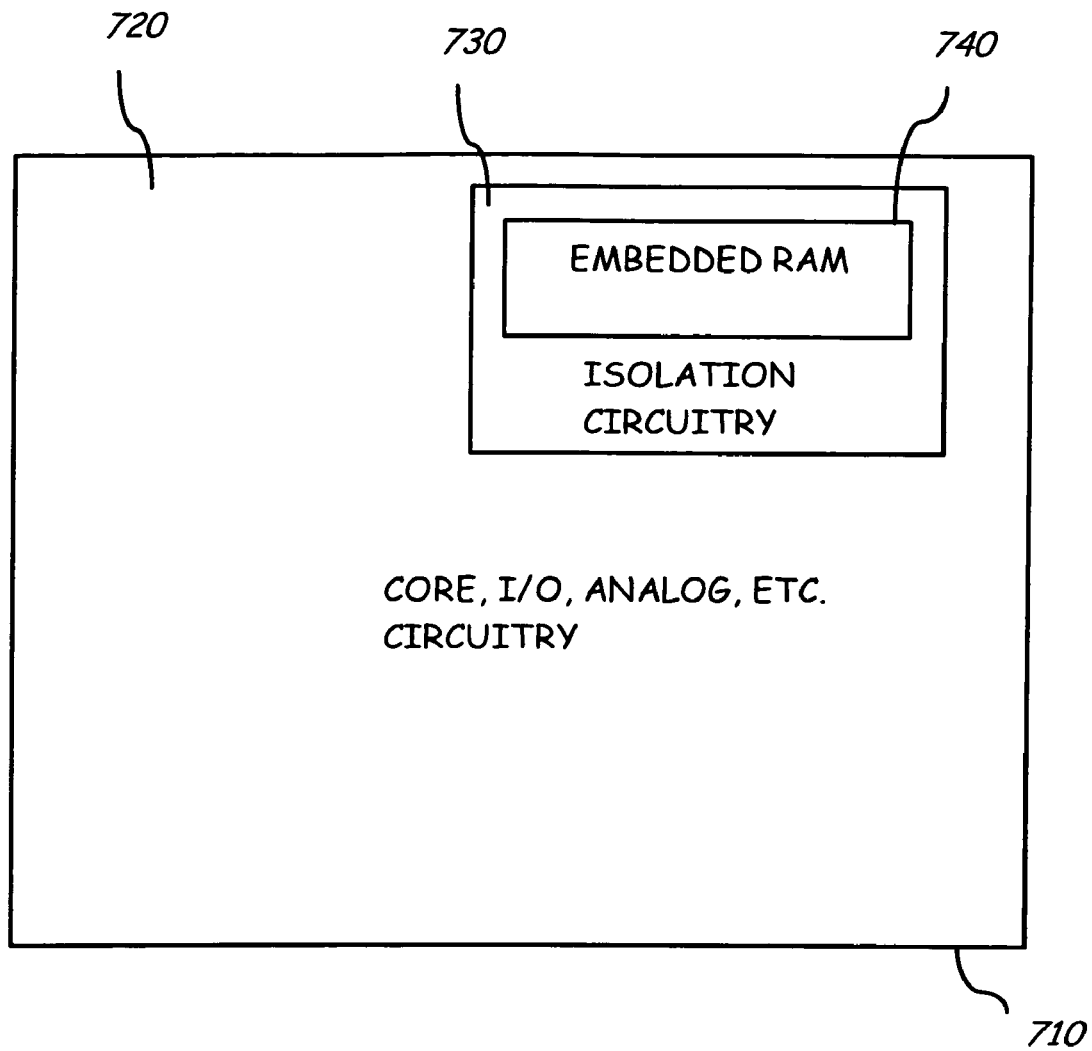
FIG. 7 illustrates an embodiment of the placement of the embedded memory with isolation circuitry on an integrated circuit substrate.

FIG. 7 illustrates an embodiment of a layout of the integrated circuit substrate 710. The integrated circuit substrate 710 may be an insulating substrate or a semiconductor substrate. An area of the substrate 710 contains the embedded memory 740 (e.g., an embedded random access memory or RAM). The embedded memory 740 is isolated by isolation circuitry 730. The embedded memory need not be surrounded by the isolation circuitry. Physically, the embedded memory 740 may be adjacent core, input/output, and/or analog circuitry 720; however, the isolation circuitry 730 must be capable of electrically isolating the embedded memory 740 from the other circuitry 720.

Figure 8:
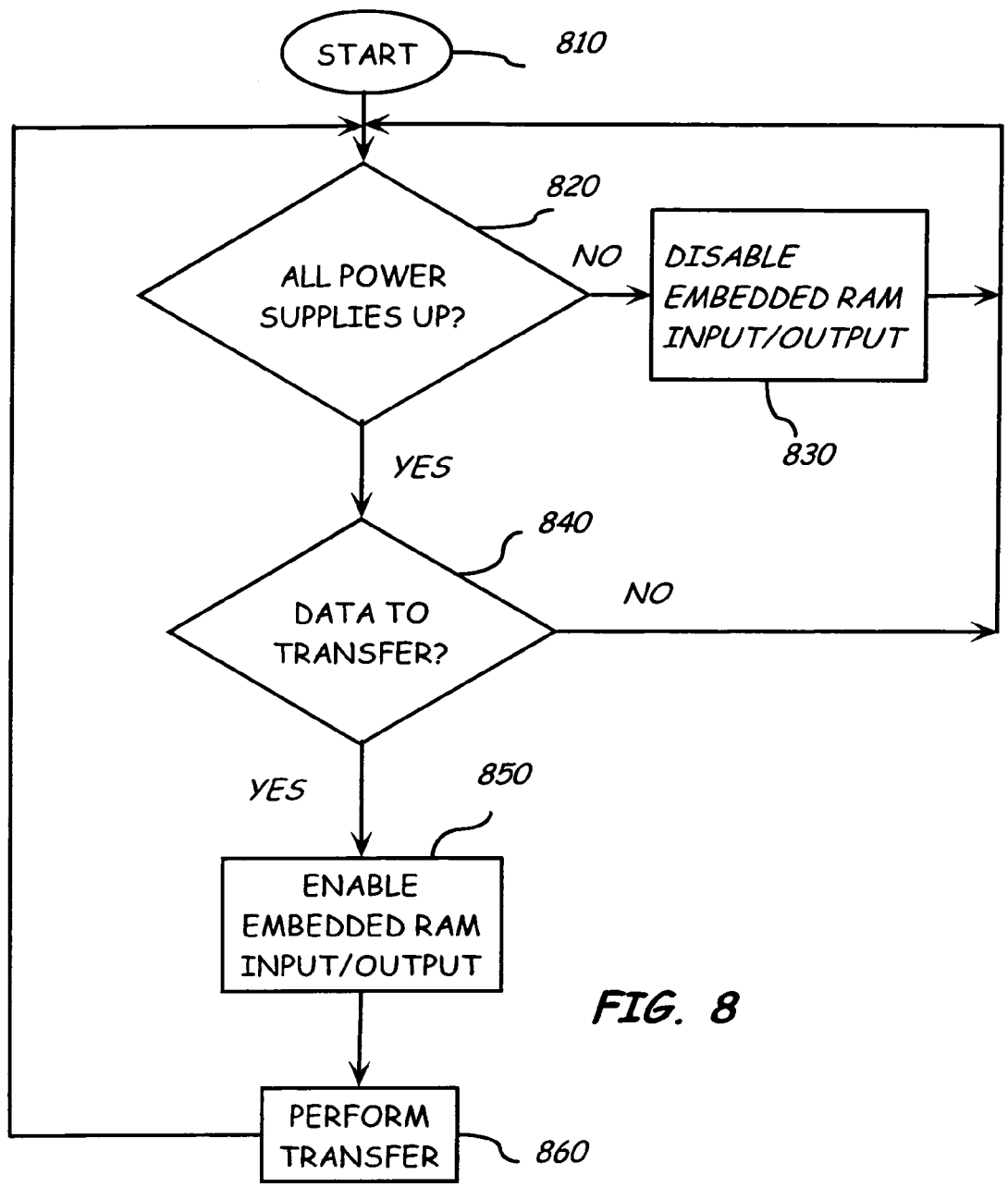
FIG. 8 illustrates a flow chart of an embodiment of the method of the present invention.

FIG. 8 illustrates a flow chart of an embodiment of a method of the present invention. At the beginning 810, if any power supply that has been tapped by the isolation cell does not supply sufficient power 820, the isolation cell disables the embedded memory input and output 830. Otherwise, if there is data to transfer 840, the isolation cell enables transfer of the data to the embedded memory 850 and the transfer is performed 860.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages, the form hereinbefore described being merely an explanatory embodiment thereof. It is the intention of the following claims to encompass and include such changes.

What is claimed is:

1. An isolation cell for isolating an embedded memory from other circuitry on an integrated circuit, comprising:
    a totem pole arrangement of switches such that each drain and source terminal of the switches are connected to one of the group consisting of drain terminals of other switches in the totem pole arrangement, source terminals of other switches in the totem pole arrangement, power, or ground, the totem pole arrangement of switches receiving a signal for an embedded memory, the totem pole arrangement of switches providing an output signal to the embedded memory; and
    a latch circuit for latching the output signal from the totem pole arrangement of switches, the output signal being supplied to the embedded memory.

2. The isolation cell of claim 1, the totem pole arrangement of switches including a switch controlled by a power level of core logic circuitry on the integrated circuit.

3. The isolation cell of claim 2, the totem pole arrangement of switches further including a switch controlled by a power level of input and output circuitry on the integrated circuit.

4. The isolation cell of claim 3, the totem pole arrangement of switches further including a switch controlled by a power level of analog circuitry on the integrated circuit.

5. The isolation cell of claim 4, the totem pole arrangement of switches further comprising a switch controlled by a first enable signal and a switch controlled by a second enable signal.

6. The isolation cell of claim 5, wherein the first and second enable signals are electrically connected to ground through pull down resistors.

* * * * *